United States Patent
McCollum et al.

(10) Patent No.: US 7,443,198 B1
(45) Date of Patent: Oct. 28, 2008

(54) NON-VOLATILE LOOK-UP TABLE FOR AN FPGA

(75) Inventors: John McCollum, Saratoga, CA (US); Gregory Bakker, San Jose, CA (US); Jonathan Greene, Palo Alto, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 11/929,287

(22) Filed: Oct. 30, 2007

Related U.S. Application Data

(63) Continuation-in-part of application No. 11/551,973, filed on Oct. 23, 2006, now Pat. No. 7,321,237, which is a continuation of application No. 11/026,336, filed on Dec. 29, 2004, now Pat. No. 7,129,748.

(51) Int. Cl.
*G06F 7/38* (2006.01)
*H03K 19/177* (2006.01)

(52) U.S. Cl. .............................. 326/40; 326/39; 326/46

(58) Field of Classification Search ............. 326/38–41, 326/46–47
See application file for complete search history.

(56) References Cited

U.S. PATENT DOCUMENTS

| | | | |
|---|---|---|---|
| 5,847,577 A | 12/1998 | Trimberger | |
| 6,297,665 B1 | 10/2001 | Bauer et al. | |
| 6,768,338 B1 * | 7/2004 | Young et al. | 326/44 |
| 7,075,333 B1 * | 7/2006 | Chaudhary et al. | 326/38 |
| 7,129,748 B1 | 10/2006 | McCollum et al. | |
| 7,321,237 B2 | 1/2008 | McCollum et al. | |
| 2003/0122578 A1 | 7/2003 | Masui et al. | |
| 2008/0007291 A1 | 1/2008 | McCollum et al. | |
| 2008/0007292 A1 | 1/2008 | McCollum et al. | |
| 2008/0007293 A1 | 1/2008 | McCollum et al. | |

OTHER PUBLICATIONS

"Virtex-II Pro™ Platform FPGAs: Functional Description", DS083-2 (v2.7) Advance Product Specification, Xilinx, Inc., pp. 25-26, Jun. 2, 2003.
"3.0 Look-Up Table—A Key Features Analysis (Configuration Logic Block—CLB) of the Xilinx Virtex II XC2V1000FG256AFT FPGA", Report ID#: 1202-6218-PC51, TECHinsights, Semiconductor Insights, Inc., pp. 8-23, unknown date.
"Xilinx XCV300-4BG352CES", Chipworks, pp. 1.0.0 CLB Block Diagram—2.2.3 LUT Data Input Selector, Revision: 1.0, Jul. 7, 1999.

* cited by examiner

*Primary Examiner*—Anh Q Tran
(74) *Attorney, Agent, or Firm*—Lewis & Roca LLP

(57) ABSTRACT

A non-volatile-memory-transistor based lookup table for an FPGA includes a n:1 multiplexer. A one input non-volatile-memory-transistor based lookup table is coupled to each of the n data inputs of the multiplexer. The multiplexer has X inputs wherein $n=2^X$ as is known in the art. A sense amplifier is coupled to the output of the multiplexer.

20 Claims, 8 Drawing Sheets

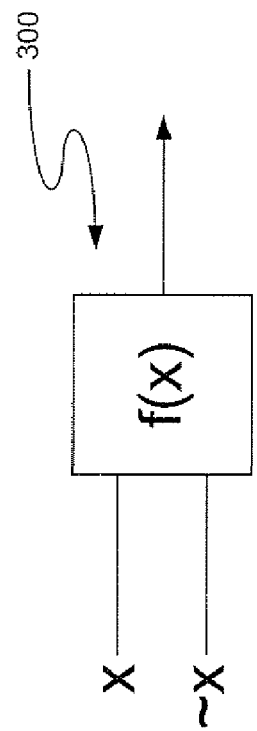
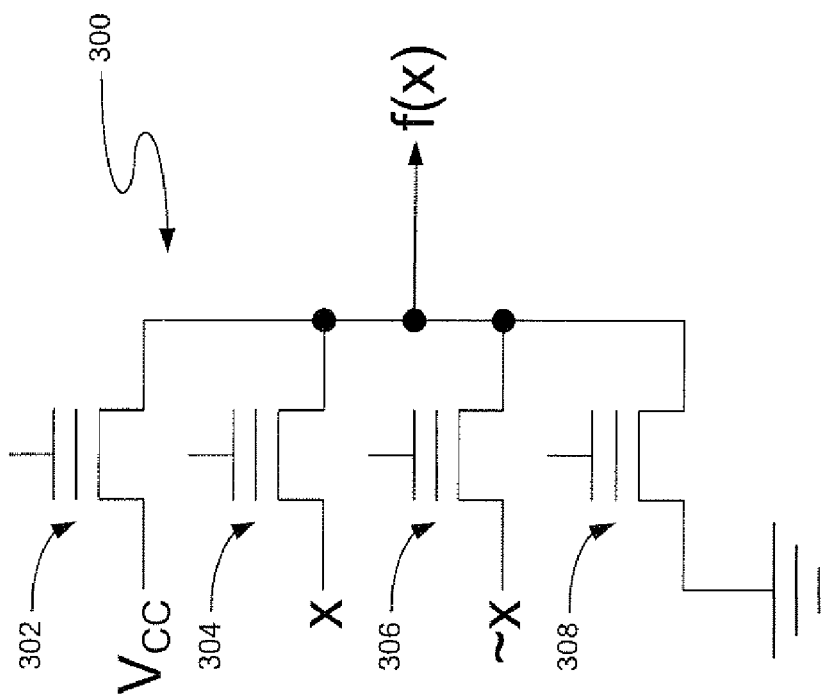
FIGURE 8B
FIGURE 8A

NON-VOLATILE LOOK-UP TABLE FOR AN FPGA

CROSS-REFERENCE TO RELATED APPLICATIONS

This application is a continuation-in-part of co-pending U.S. patent application Ser. No. 11/551,973, filed Oct. 23, 2006, which is a continuation of U.S. patent application Ser. No. 11/026,336, filed Dec. 29, 2004, now issued as U.S. Pat. No. 7,129,748.

BACKGROUND OF THE INVENTION

1. Field of the Invention

The present invention relates to programmable integrated circuits. More particularly, the present invention relates to field-programmable-gate-array (FPGA) integrated circuits and to non-volatile lookup tables for use in such integrated circuits.

2. The Prior Art

Programmable integrated circuits such as FPGA integrated circuits are known in the art. An emerging trend has been to employ non-volatile memory elements in FPGA integrated circuits.

Some FPGA integrated circuits employ lookup tables (LUTs) to implement programmable logic functions. Such LUTs typically have some number n inputs coupled to the n address inputs of a $2^n$-to-1 multiplexer, while $2^n$ configuration bits are typically coupled to the $2^n$ data inputs of the multiplexer. LUTs built in this particular style typically use volatile-memory technology such as SRAM as the configuration bits. The advantage of such an arrangement is simplicity of logic function generation by means of the LUT and ease of reprogramming by means of the volatile-memory technology. The disadvantage of this approach is that volatile-memory technology requires that the FPGA be reprogrammed periodically, particularly after a system power up. Volatile-memory based FPGA integrated circuits that use LUT technology are available from, for example, Xilinx of San Jose, Calif.

Other FPGA integrated circuits employ multiplexer-based modules to implement programmable logic functions. Such modules are typically built around a $2^M$-to-1 multiplexer with M address inputs and $2^M$ data inputs and can be used, in conjunction with an inverter module, to implement (as a subset of the total functionality) any logic function of M+1 variables. Since all of the M+1 inputs are interchangeable, this subset of the functionality is like a LUT. Multiplexer-based modules built in this style typically use antifuses as the programmable technology. The advantage of this approach is the non-volatility of the antifuse element. The disadvantage is the one-time programmability of the antifuse which precludes reprogramming the FPGA. Antifuse based FPGA integrated circuits that use multiplexer-based modules are available from, for example, Actel of Mountain View, Calif.

Thus, non-volatile memory elements which are reprogrammable may be advantageously employed in LUT-based FPGA integrated circuits, having all of the advantages and none of the disadvantages described above.

BRIEF DESCRIPTION OF THE INVENTION

According to one aspect of the present invention, a non-volatile-memory-transistor based lookup table for an FPGA includes a multiplexer having x address inputs, $2^x$ data inputs, and an output. A non-volatile memory transistor is coupled to each of the data inputs of the multiplexer. An address transition detector circuit has an input coupled to each of the address inputs of the data multiplexer. A pullup transistor is coupled to the output of the multiplexer. The gate of the pullup transistor is coupled to the output of the address transition detector circuit. A sense amplifier is coupled to the output of the multiplexer.

BRIEF DESCRIPTION OF THE DRAWING FIGURES

FIG. 8A is schematic diagram showing a one input lookup table employing non-volatile memory transistors according to the principles of the present invention.

FIG. 8B is logic diagram showing a one input lookup table employing non-volatile memory transistors according to the principles of the present invention.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
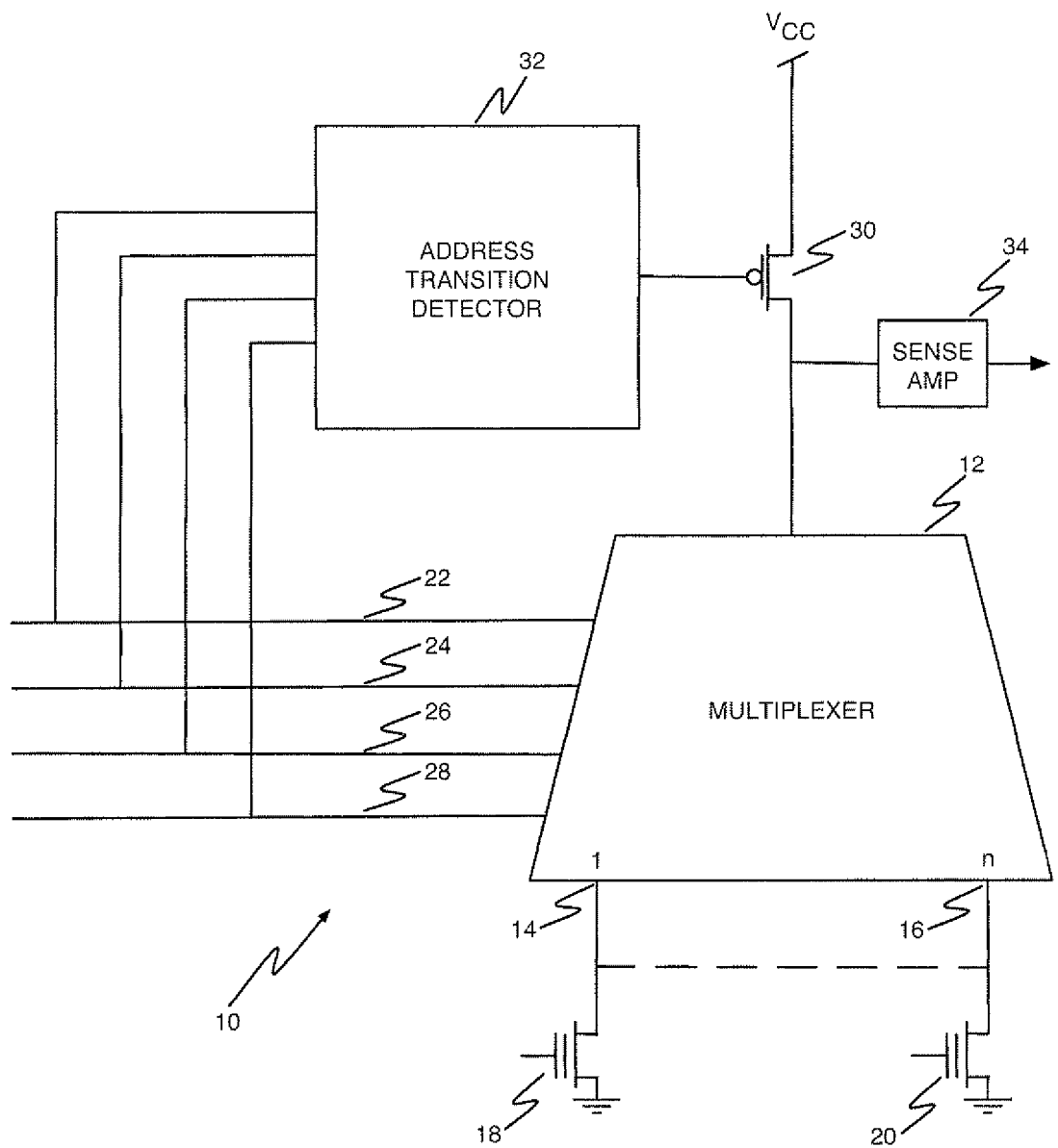
FIG. 1 is a diagram showing a first illustrative embodiment of a lookup table employing non-volatile memory transistors according to the principles of the present invention.

Referring first to FIG. 1, a diagram shows an illustrative embodiment of a lookup table (LUT) 10 employing non-volatile-memory transistors according to the present invention. LUT 10 includes multiplexer 12 having n data inputs. Two representative data inputs are shown at reference numerals 14 and 16. Each data input of multiplexer 12 is coupled to a non-volatile memory transistor. Non-volatile memory transistor 18 is shown coupled to data input "1" and non-volatile memory transistor 20 is shown coupled to data input "n".

Non-volatile, reprogrammable LUTs according to the present invention may be implemented with various known non-volatile transistor technologies, such as floating gate, nano-crystal, SONOS, etc. An example of a flash (floating gate) based LUT is shown in FIG. 1.

Multiplexer 12 also has a plurality of address inputs. Four such inputs are shown at reference numerals 22, 24, 26, and 28. The number of address inputs will, of course, vary as a function of the number of data inputs. As will be appreciated by persons of ordinary skill in the art, the number of address and data inputs are related such that a multiplexer having x number of address inputs will have $n=2^x$ data inputs. The four-address input multiplexer 12 of FIG. 1 has sixteen data inputs as known by persons of ordinary skill in the art.

The output of multiplexer 12 is pulled up using p-channel MOS pull-up transistor 30, having its source coupled to $V_{CC}$ and its drain coupled to the output of multiplexer 12. Persons of ordinary skill in the art familiar with the structure of multiplexers will appreciate that non-volatile memory transistor 18 and non-volatile memory transistor 20 can pull their respective multiplexer data inputs down, but cannot source current to pull the inputs up to a logic-one voltage level. P-channel MOS pull-up transistor 30 provides a means to pull up to logic one voltage levels.

The gate of n-channel MOS pull-up transistor 30 is coupled to the output of address transition detector circuit 32. Address transition detector circuit 32 detects an address transition on one or more address lines 22, 24, 26, and 28 and, in response, drives the gate of n-channel MOS pull-up transistor low to turn it on. The output state of multiplexer 12 is then sensed by sense amplifier 34.

Figure 2:
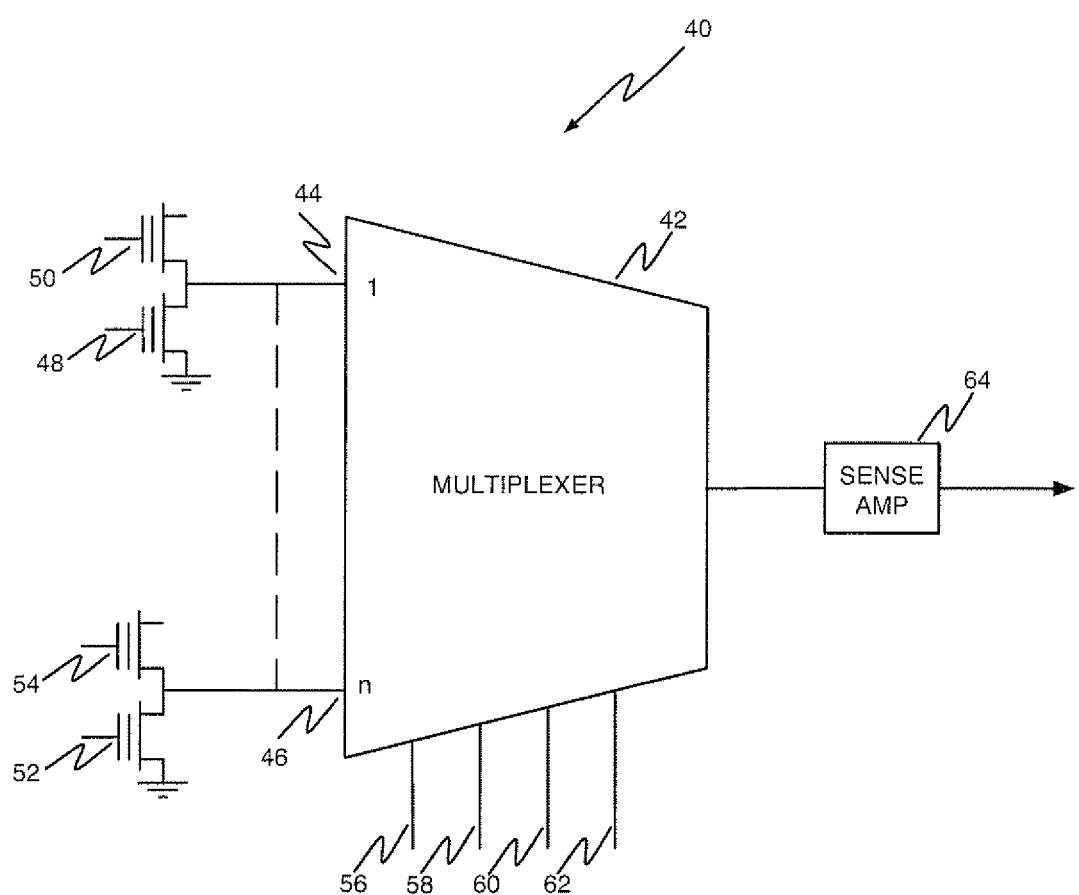
FIG. 2 is a diagram showing a second illustrative embodiment of lookup table employing non-volatile memory transistors according to the principles of the present invention.

Referring now to FIG. 2, a diagram shows a second illustrative embodiment of a lookup table (LUT) 40 employing non-volatile-memory transistors according to the present invention. LUT 40 includes multiplexer 42 having n data inputs. Two representative data inputs are shown at reference numerals 44 and 46. Each data input of multiplexer 42 is coupled to a memory cell including a pair of non-volatile memory transistors connected in series between a power-supply potential $V_{CC}$ and ground. The output of non-volatile memory transistor pair 48 and 50 is the common connection between the drain of transistor 48 and the source of transistor 50 and is shown coupled to data input "1." The output of non-volatile memory transistor pair 48 and 50 is the common connection between the drain of non-volatile memory transistor 52 and the source of non-volatile memory transistor 54 and is shown coupled to data input "n." In operation, one of the transistors of non-volatile memory transistor pairs 48 and 50 and 52 and 54 will be turned on and the other one will be turned off, either pulling down or pulling up the input of the multiplexer to which they are connected.

Multiplexer 42 also has a plurality of address inputs. Four such inputs are shown at reference numerals 56, 58, 60, and 62. The number of address inputs will, of course, vary as a function of the number of data inputs. As will be appreciated by persons of ordinary skill in the art, the number of address and data inputs are related such that a multiplexer having x number of address inputs may have a maximum of $n=2^x$ data inputs. The four-address input multiplexer 42 of FIG. 2 may have sixteen data inputs as known by persons of ordinary skill in the art. The output of multiplexer 42 is sensed by sense amplifier 64.

Unlike the embodiment of FIG. 1, the embodiment of FIG. 2 does not require a p-channel MOS pull-up transistor because one of the non-volatile memory transistors (50 or 54) of the memory cell pulls up the output of the multiplexer if it is turned on.

Figure 3:
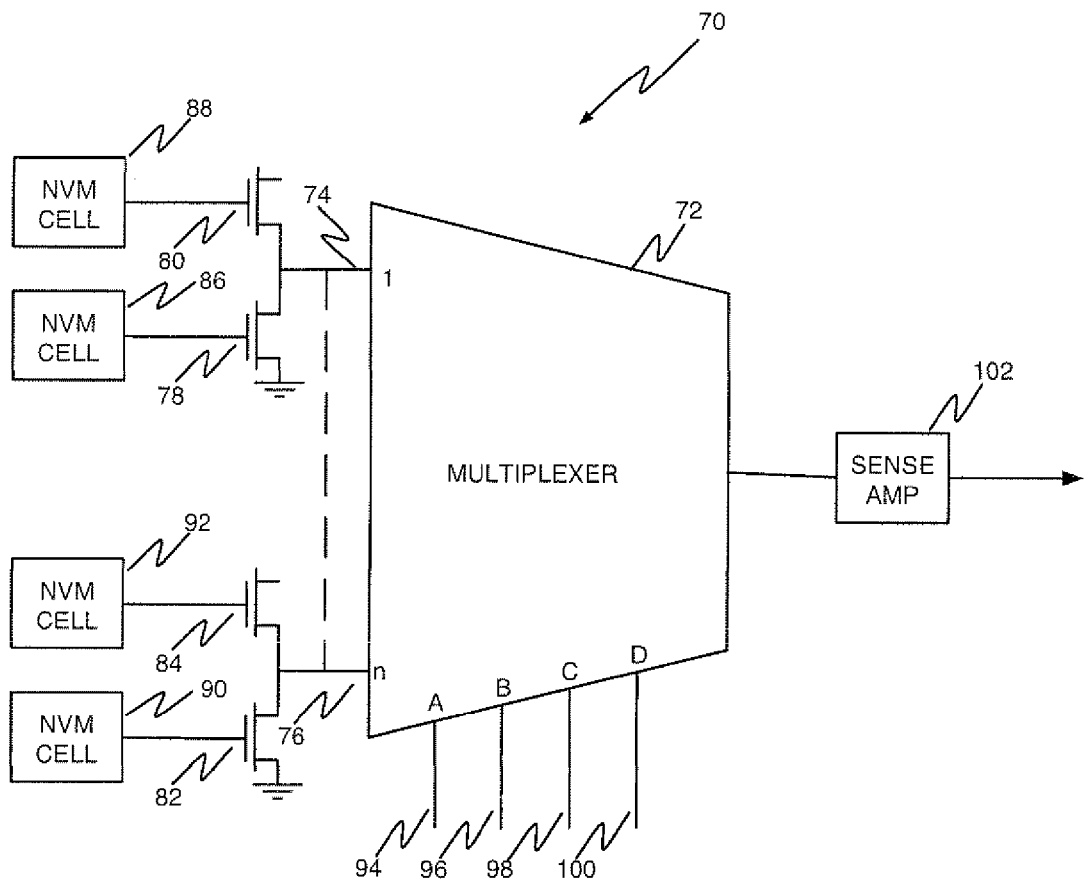
FIG. 3 is a diagram showing a third illustrative embodiment of a lookup table employing non-volatile memory transistors according to the principles of the present invention.

Referring now to FIG. 3, a diagram shows a third illustrative embodiment of a lookup table (LUT) 70 employing non-volatile-memory transistors according to the present invention. LUT 70 includes multiplexer 72 having n data inputs. Two representative data inputs are shown at reference numerals 74 and 76. Each data input of multiplexer 72 is coupled to a pair of n-channel MOS transistors connected in series between a power-supply potential $V_{CC}$ and ground. The output of n-channel MOS transistor pair 78 and 80 is the common connection between the drain of n-channel MOS transistor 78 and the source of n-channel MOS transistor 80 and is shown coupled to data input "1." The output of n-channel MOS transistor pair 78 and 80 is the common connection between the drain of n-channel MOS transistor 82 and the source of n-channel MOS transistor 84 and is shown coupled to data input "n." In operation, one of the transistors of n-channel MOS transistor pairs 78 and 80 and 82 and 84 will be turned on and the other one will be turned off, either pulling down or pulling up the input of the multiplexer to which they are connected.

The gate of n-channel MOS transistor 78 is coupled to the output of non-volatile memory cell 86. The gate of n-channel MOS transistor 80 is coupled to the output of non-volatile memory cell 88. The gate of n-channel MOS transistor 82 is coupled to the output of non-volatile memory cell 90. The gate of n-channel MOS transistor 84 is coupled to the output of non-volatile memory cell 92. As will be appreciated by persons of ordinary skill in the art, non-volatile memory cells 86, 88, 90, and 92 may be implemented using any one of a large number of circuit configurations that use any of the various non-volatile transistor technologies, such as, but not limited to, floating gate, nitride charge-trapping, nano-crystal, SONOS, etc.

Multiplexer 72 also has a plurality of address inputs. Four such inputs are shown at reference numerals 94, 96, 98, and 100. The number of address inputs will, of course, vary as a function of the number of data inputs. As will be appreciated by persons of ordinary skill in the art, the number of address and data inputs are related such that a multiplexer having x number of address inputs will have $n=2^x$ data inputs. The four-address input multiplexer 72 of FIG. 3 has sixteen data inputs as known by persons of ordinary skill in the art. The output of multiplexer 42 is sensed by sense amplifier 102.

Figure 4:
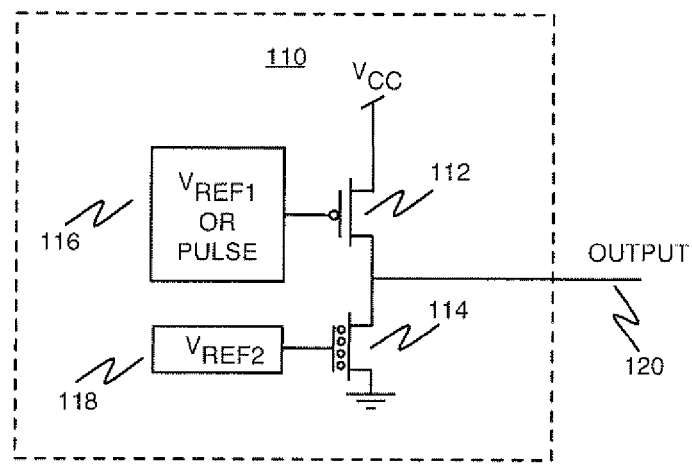
FIG. 4 is a schematic diagram of an exemplary nano-crystal non-volatile memory cell that may be employed in the lookup tables of the present invention.

Referring now to FIG. 4, a schematic diagram shows an exemplary nano-crystal non-volatile memory cell 110 that may be employed in the lookup tables of FIG. 3 and the other lookup tables of the present invention. Nano-crystal non-volatile memory cell 110 includes a p-channel MOS transistor 112 connected in series with a nano-crystal memory cell transistor 114 between a voltage supply V and ground. The voltage supply may be at a potential higher than the $V_{CC}$ voltage supply used in the circuitry to which cell 110 is coupled, such as n-channel MOS transistors 78, 80, 82, and 84 in FIG. 3, and other similar transistors in other drawing figures herein.

The gate of p-channel MOS transistor 112 is coupled to either a first reference voltage $V_{REF1}$ (e.g., about 3.1V) or to a pulse supply (reference numeral 116) that provides pulses that go negative from the voltage potential V. The gate of nano-crystal memory cell transistor 114 is coupled to a second reference voltage $V_{REF2}$ (e.g., about 2V), shown at reference numeral 118. As will be appreciated by persons of ordinary skill in the art, nano-crystal memory cell transistor 114 is turned on when it is erased, thus pulling the output node 120 to ground. Nano-crystal memory cell transistor 114 is turned off when it is programmed, and p-channel MOS transistor 114 is used to pull up the output node 120. As will be appreciated by persons of ordinary skill in the art, nano-crystal memory cell transistor 114 exhibits junction leakage or subthreshold leakage when it is turned off, so p-channel MOS transistor 112 biased by either the first reference voltage $V_{REF1}$ or the pulse supply is used to keep the output node 120 at a high state when nano-crystal memory cell transistor 114 is turned off.

Figure 5:
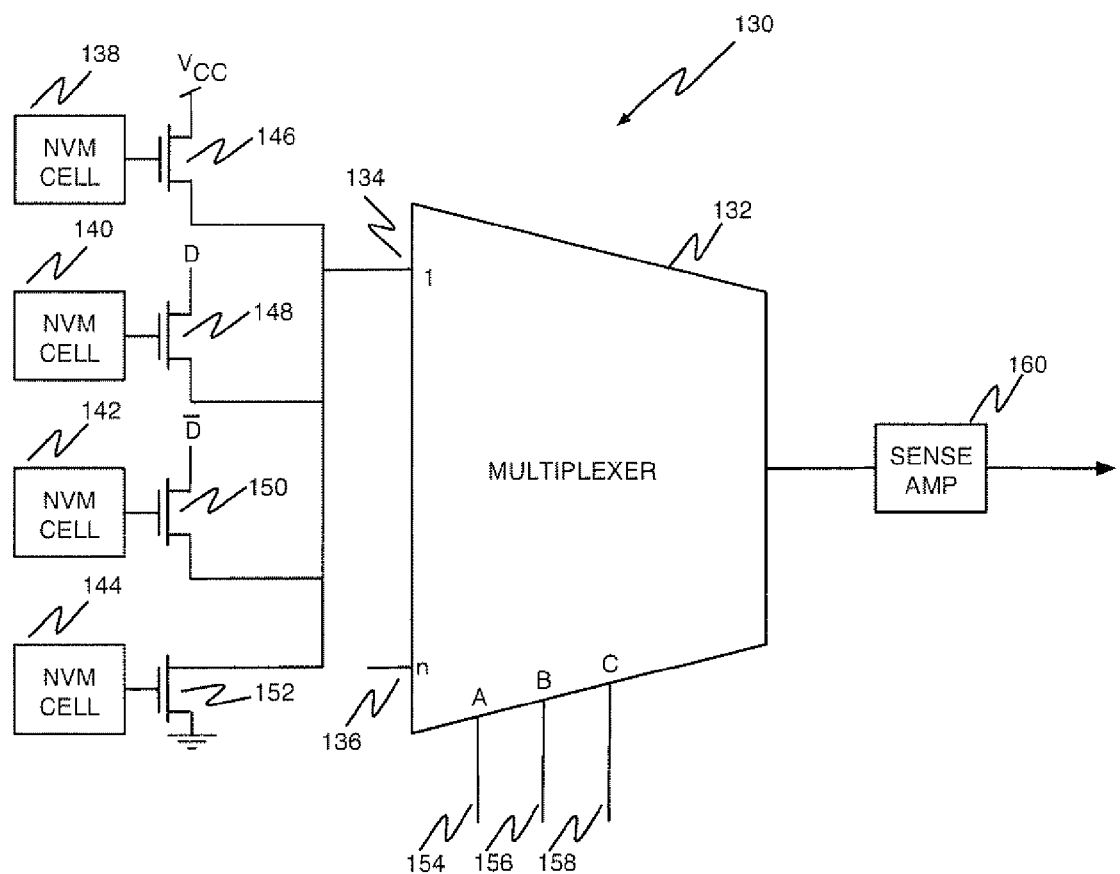
FIG. 5 is a diagram showing a fourth illustrative embodiment of a lookup table employing non-volatile memory transistors according to the principles of the present invention.

Referring now to FIG. 5, a diagram shows a fourth illustrative embodiment of a lookup table 130 employing non-volatile memory transistors according to the principles of the present invention. LUT 130 includes multiplexer 132 having n data inputs. Two representative data inputs are shown at reference numerals 134 and 136. Each data input of multiplexer 72 is coupled to the sources of four n-channel MOS transistors each having a gate driven from the output of a non-volatile memory cell. Thus, non-volatile memory cells 138, 140, 142, and 144 drive the fates of n-channel MOS transistors 146, 148, 150, and 152, respectively.

The drain of n-channel MOS transistor 146 is coupled to $V_{CC}$. The drain of n-channel MOS transistor 148 is coupled to a source of a "D" input signal that would otherwise be coupled to a "D" address input of multiplexer 132. The drain of n-channel MOS transistor 150 is coupled to a source of the complemented "D" input signal that may be provided by inverting the "D" signal as is known in the art. The drain of n-channel MOS transistor 152 is coupled to ground. One of the four memory cells is turned on to drive one of the n-channel MOS transistors and the other three are left off.

As shown in FIG. 5, the multiplexer 132 has only three address inputs A, B, and C, at reference numerals 154, 156, and 158, respectively. However, the circuit is capable of providing the same number of functions that it would have if four address inputs were used. The output of multiplexer 132 is sensed by sense amplifier 160.

Figure 6A:
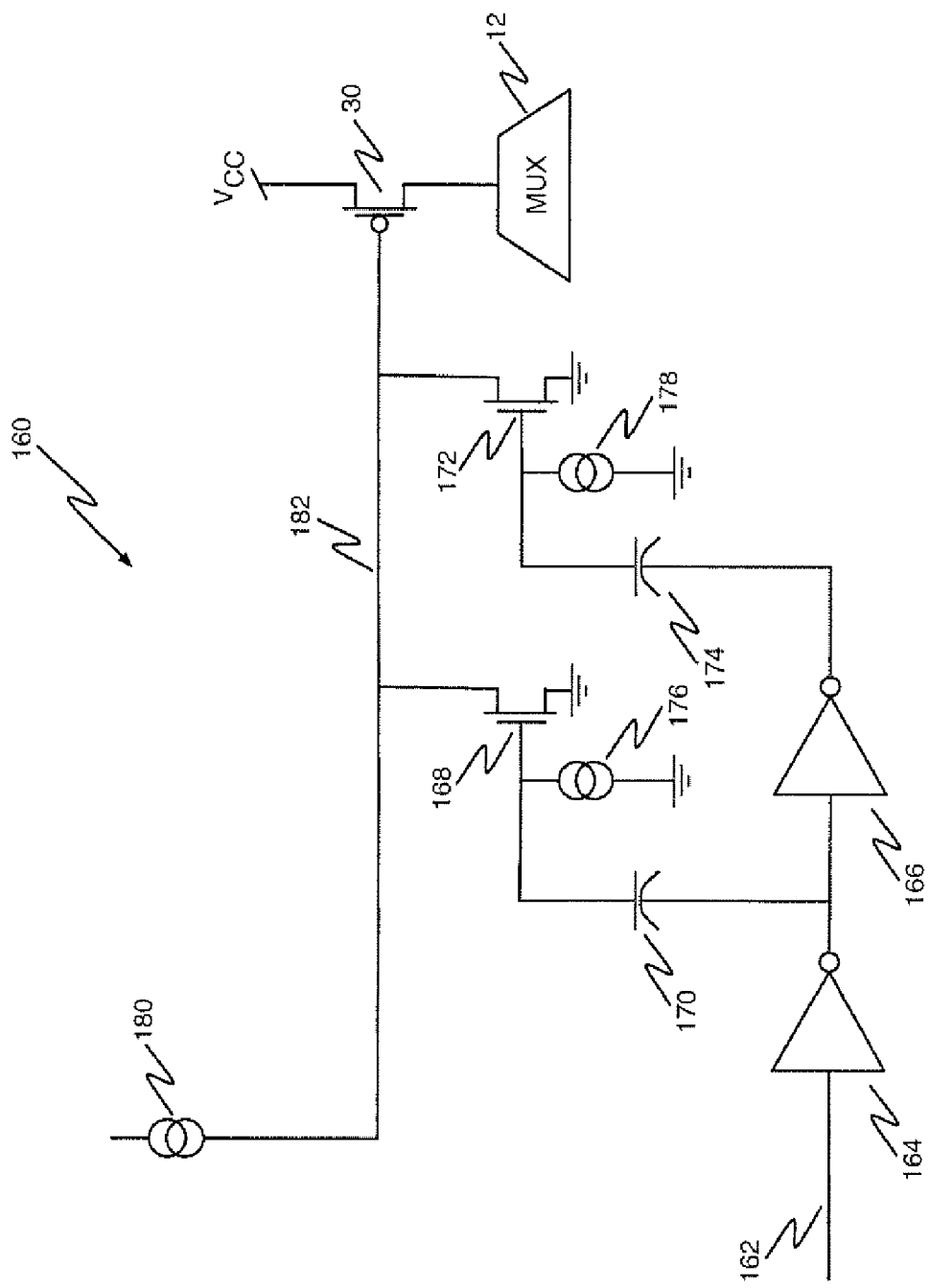
FIGS. 6A and 6B are, respectively, schematic diagrams of illustrative analog and digital address-transition-decoder circuits that may be used with the lookup table of FIG. 1.
Figure 6B:
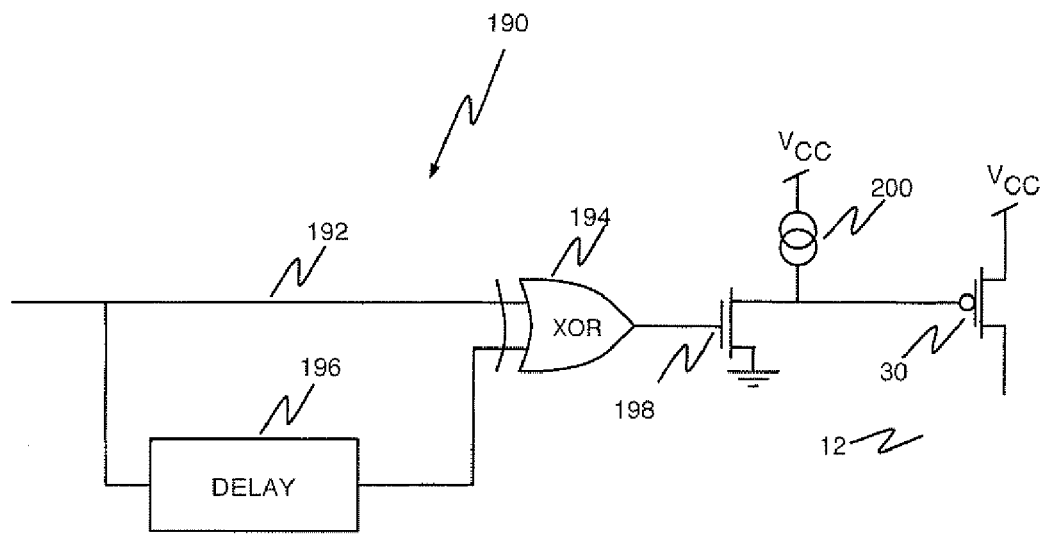

Referring now to FIGS. 6A and 6B, respectively, schematic diagrams of illustrative analog and digital address-transition-decoder circuits are shown that may be used with the lookup table of FIG. 1. Referring first to FIG. 6A, an analog address-transition-decoder circuit 160 for a single address line is shown. Persons of ordinary skill in the art will recognize that one of circuits 160 is provided for each address line.

Address line "A" at reference numeral 162 is inverted twice by cascaded inverters 164 and 166. The output of inverter 164 is coupled to the gate of n-channel MOS transistor 168 through capacitor 170. Similarly, the output of inverter 166 is coupled to the gate of n-channel MOS transistor 172 through capacitor 174. Current source 176 is coupled to the gate of n-channel MOS transistor 168 and current source 178 is coupled to the gate of n-channel MOS transistor 172. The drains of n-channel MOS transistors 168 and 172 are coupled to current source 180.

When address line "A" makes a transition from low to high or from high to low, the output of one of inverters 164 and 166 goes to a logic low level. The high-going transition is coupled to the gate of one of transistors 168 and 172 through its respective capacitor 170 or 174, and temporarily turns on these transistors. The capacitor charge is replenished by one of current sources 176 and 178, both of which are weak relative to the current through the capacitor during a transition. These current sources return the gates of NMOS 168 and 172 to ground potential in steady state conditions. Current source 180, which returns line 182 to $V_{CC}$ during steady state, is weak with respect to the temporary current through either of n-channel MOS transistors 168 and 172. This action causes a pulse to be generated on pulse output line 182, coupled to the gate of p-channel MOS pullup transistor 30 of FIG. 1 and FIG. 6B, which temporarily pulls the output of multiplexer 12 high.

Referring now to FIG. 6B, a digital address-transition-decoder circuit 190 for a single address line is shown. Persons of ordinary skill in the art will recognize that one of circuits 190 is provided for each address line.

Address line "A" at reference numeral 192 is presented to a first input of EXOR gate 194. The second input of EXOR gate 194 is coupled to address line "A" through delay circuit 196, which may comprise an even number of inverters, for example eight inverters. The output of EXOR gate 194 drives the gate of n-channel MOS transistor 198. Current source 200 and the gate of p-channel MOS pullup transistor 30 are coupled to the drain of n-channel MOS transistor 198 of FIG. 1. The drains of transistors 198 for the digital address-transition-detector circuits for the other address lines are also coupled to the current source 200 and the gate of p-channel MOS pullup transistor 30. During address transitions of address line "A," the signal to the second input of EXOR gate 194 is delayed, producing a pulse at its output.

Figure 7:
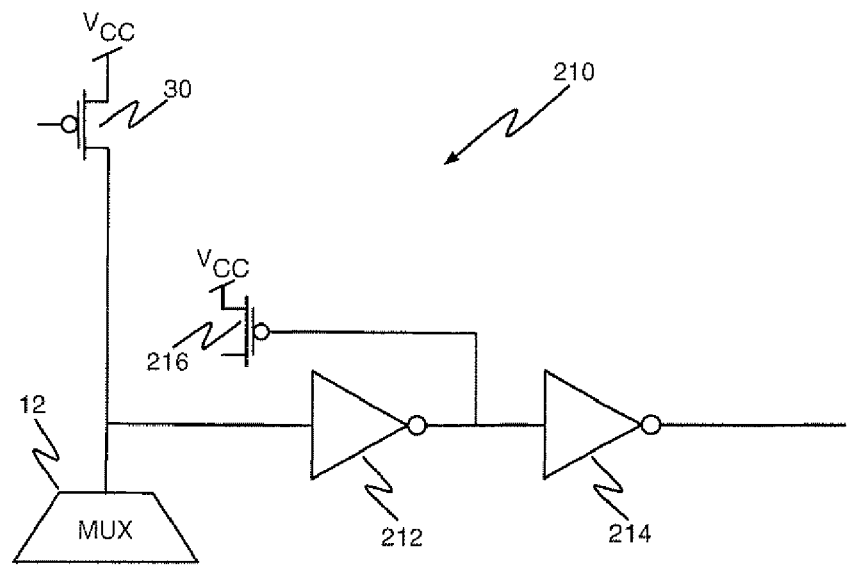
FIG. 7 is a schematic diagram of an illustrative sense-amplifier circuit that may be used with the lookup tables of the present invention.

Referring now to FIG. 7, a schematic diagram shows an illustrative sense-amplifier circuit 210 that may be used with the lookup tables of the present invention. Multiplexer 12 and pullup transistor 30 from FIG. 1 are shown. Inverters 212 and 214 are cascaded. P-channel MOS transistor 216 provides feedback to produce a latching action around inverter 212.

Referring now to FIG. 8A, a schematic diagram of an illustrative one input lookup table employing non-volatile memory transistors according to the principles of the present invention. One input lookup table 300 is shown comprising four non-volatile memory transistors 302, 304, 306, and 308. Transistor 302 couples $V_{CC}$ to the output node labeled f(X), transistor 304 couples the node labeled X to the output of node labeled f(X), transistor 306 couples the node labeled ~X to the output node labeled f(X), and transistor 308 couples the node connected to ground to the output node labeled f(X). The signal on the node labeled ~X is the complement of the X signal that may be provided by inverting the X signal as is known in the art.

During normal operation, only one of the four non-volatile memory transistors 302, 304, 306, and 308 is to be programmed on while the other three transistors are to be programmed off. Thus one input lookup table 300 implements one of the four binary functions of a single variable X: logic-1 (represented by $V_{CC}$), X, the binary compliment of X (represented by ~X), and logic-0 (represented by ground).

Referring now to FIG. 8B showing a logic diagram of a one input lookup table employing non-volatile memory transistors according to the principles of the present invention. Shown in FIG. 8B is the one input lookup table 300 of FIG. 8A represented by a logic symbol. Shown are the connections to X and ~X while the connections to VCC and ground (which are logically static and whose logic value can be assumed) are not shown.

Figure 9:
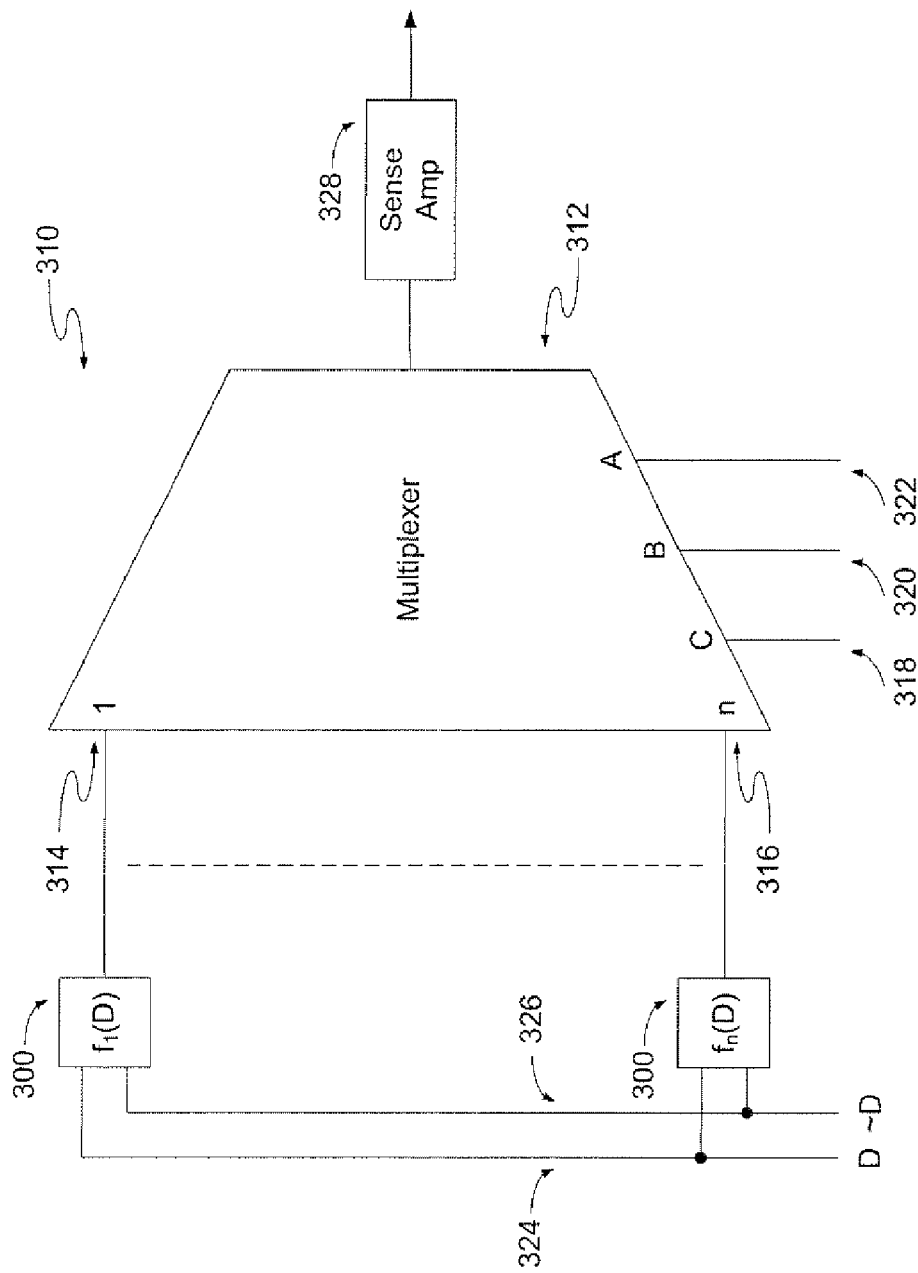
FIG. 9 is schematic diagram showing a fifth illustrative embodiment of a lookup table employing non-volatile memory transistors according to the principles of the present invention.

Referring now to FIG. 9, a schematic diagram shows a fifth illustrative embodiment of a lookup table 310 employing non-volatile memory transistors according to the principles of the present invention. LUT 310 includes multiplexer 312 having n data inputs. Two representative data inputs are shown at reference numerals 314 and 316. Each data input of multiplexer 312 is coupled to the output of a one input lookup table 300.

As shown in FIG. 9, the multiplexer 312 has only three inputs A, B, and C, at reference numerals 318, 320, and 322, respectively. However, the circuit is capable of providing the same number of functions that it would have if four address inputs were used. The additional input is provided by the source of the D signal 324 that would otherwise be coupled to a D address input of multiplexer 310. The source of the ~D signal 326 is the complement of the D signal that may be provided by inverting the D signal as is known in the art.

The output of multiplexer 312 is sensed by sense amplifier 328. Sense amplifier 328 is needed if the output of multiplexer 312 does not produce a full logic swing from $V_{CC}$ to ground or if the drive strength of the signal is very weak. Persons skilled in the art will realize that the presence of sense amplifier 328 is optional depending on the internal construction of multiplexer 312.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile-memory-transistor based lookup table for an FPGA, comprising:
    a VCC power supply;
    a ground supply;
    X lookup table inputs wherein X is a positive integer;
    a lookup table output;
    a multiplexer having X address inputs, Y data inputs, and an output, wherein each address input is coupled to a separate one of said lookup table inputs, the output is coupled to the lookup table output, and Y=2X;
    an additional lookup table input;
    an inverting circuit with an input coupled to said additional lookup table input and an output;
    a first group of Y transistors programmably coupling said VCC supply and separate ones of the Y data inputs of said multiplexer;
    a second group of Y transistors programmably coupling said additional lookup table input and separate ones of the Y data inputs of said multiplexer;
    a third group of Y transistors programmably coupling the output of said inverting circuit and separate ones of the Y data inputs of said multiplexer; and
    a fourth group of Y transistors programmably coupling said ground supply and separate ones of the Y data inputs of said multiplexer.

2. A non-volatile-memory-transistor based lookup table for an FPGA according to claim 1, further comprising:
    a sense amplifier coupled between the output of said multiplexer and said lookup table output.

3. A non-volatile-memory-transistor based lookup table for an FPGA according to claim 2, wherein:
    said first group of Y transistors are non-volatile-memory transistors;
    said second group of Y transistors are non-volatile-memory transistors;
    said third group of Y transistors are non-volatile-memory transistors; and
    said fourth group of Y transistors are non-volatile-memory transistors.

4. A non-volatile-memory-transistor based lookup table for an FPGA according to claim 2, wherein:
    said first group of Y transistors are MOS transistors;
    said second group of Y transistors are MOS transistors;
    said third group of Y transistors are MOS transistors; and
    said fourth group of Y transistors are MOS transistors.

5. A non-volatile-memory-transistor based lookup table for an FPGA according to claim 2, wherein:
    said first group of Y transistors are n-channel MOS transistors;
    said second group of Y transistors are n-channel MOS transistors;
    said third group of Y transistors are n-channel MOS transistors; and
    said fourth group of Y transistors are n-channel MOS transistors.

6. A non-volatile-memory-transistor based lookup table for an FPGA according to claim 1, wherein:
    said first group of Y transistors are non-volatile-memory transistors;
    said second group of Y transistors are non-volatile-memory transistors;
    said third group of Y transistors are non-volatile-memory transistors; and
    said fourth group of Y transistors are non-volatile-memory transistors.

7. A non-volatile-memory-transistor based lookup table for an FPGA according to claim 1, wherein:
    said first group of Y transistors are MOS transistors;
    said second group of Y transistors are MOS transistors;
    said third group of Y transistors are MOS transistors; and
    said fourth group of Y transistors are MOS transistors.

8. A non-volatile-memory-transistor based lookup table for an FPGA according to claim 1, wherein:
    said first group of Y transistors are n-channel MOS transistors;
    said second group of Y transistors are n-channel MOS transistors;
    said third group of Y transistors are n-channel MOS transistors; and
    said fourth group of Y transistors are n-channel MOS transistors.

9. A non-volatile-memory-transistor based lookup table for an FPGA, comprising:
    a VCC power supply;
    a ground supply;
    X lookup table inputs wherein X is a positive integer;
    a lookup table output;
    a multiplexer having X address inputs, Y data inputs, and an output, wherein each address input is coupled to a separate one of said lookup table inputs, the output is coupled to the lookup table output, and Y=2X;
    a first additional lookup table input;
    a second additional lookup table input;
    a first group of Y transistors programmably coupling said VCC supply and separate ones of the Y data inputs of said multiplexer;
    a second group of Y transistors programmably coupling said first additional lookup table input and separate ones of the Y data inputs of said multiplexer;
    a third group of Y transistors programmably coupling said second additional lookup table input and separate ones of the Y data inputs of said multiplexer; and
    a fourth group of Y transistors programmably coupling said ground supply and separate ones of the Y data inputs of said multiplexer.

10. A non-volatile-memory-transistor based lookup table for an FPGA according to claim 9, wherein:
    said second additional lookup table input may be configured to carry the binary complement of said first additional lookup table input.

11. A non-volatile-memory-transistor based lookup table for an FPGA according to claim 10, further comprising:
    a sense amplifier coupled between the output of said multiplexer and said lookup table output.

12. A non-volatile-memory-transistor based lookup table for an FPGA according to claim 11, wherein:
    said first group of Y transistors are non-volatile-memory transistors;
    said second group of Y transistors are non-volatile-memory transistors;
    said third group of Y transistors are non-volatile-memory transistors; and
    said fourth group of Y transistors are non-volatile-memory transistors.

13. A non-volatile-memory-transistor based lookup table for an FPGA according to claim 11, wherein:
   said first group of Y transistors are MOS transistors;
   said second group of Y transistors are MOS transistors;
   said third group of Y transistors are MOS transistors; and
   said fourth group of Y transistors are MOS transistors.

14. A non-volatile-memory-transistor based lookup table for an FPGA according to claim 11, wherein:
   said first group of Y transistors are n-channel MOS transistors;
   said second group of Y transistors are n-channel MOS transistors;
   said third group of Y transistors are n-channel MOS transistors; and
   said fourth group of Y transistors are n-channel MOS transistors.

15. A non-volatile-memory-transistor based lookup table for an FPGA according to claim 10, wherein:
   said first group of Y transistors are non-volatile-memory transistors;
   said second group of Y transistors are non-volatile-memory transistors;
   said third group of Y transistors are non-volatile-memory transistors; and
   said fourth group of Y transistors are non-volatile-memory transistors.

16. A non-volatile-memory-transistor based lookup table for an FPGA according to claim 10, wherein:
   said first group of Y transistors are MOS transistors;
   said second group of Y transistors are MOS transistors;
   said third group of Y transistors are MOS transistors; and
   said fourth group of Y transistors are MOS transistors.

17. A non-volatile-memory-transistor based lookup table for an FPGA according to claim 10, wherein:
   said first group of Y transistors are n-channel MOS transistors;
   said second group of Y transistors are n-channel MOS transistors;
   said third group of Y transistors are n-channel MOS transistors; and
   said fourth group of Y transistors are n-channel MOS transistors.

18. A non-volatile-memory-transistor based lookup table for an FPGA according to claim 9, wherein:
   said first group of Y transistors are non-volatile-memory transistors;
   said second group of Y transistors are non-volatile-memory transistors;
   said third group of Y transistors are non-volatile-memory transistors; and
   said fourth group of Y transistors are non-volatile-memory transistors.

19. A non-volatile-memory-transistor based lookup table for an FPGA according to claim 9, wherein:
   said first group of Y transistors are MOS transistors;
   said second group of Y transistors are MOS transistors;
   said third group of Y transistors are MOS transistors; and
   said fourth group of Y transistors are MOS transistors.

20. A non-volatile-memory-transistor based lookup table for an FPGA according to claim 9, wherein:
   said first group of Y transistors are n-channel MOS transistors;
   said second group of Y transistors are n-channel MOS transistors;
   said third group of Y transistors are n-channel MOS transistors; and
   said fourth group of Y transistors are n-channel MOS transistors.

* * * * *